US007984413B2

(12) United States Patent
Orita et al.

(10) Patent No.: US 7,984,413 B2
(45) Date of Patent: Jul. 19, 2011

(54) WIRING DESIGN PROCESSING METHOD AND WIRING DESIGN PROCESSING APPARATUS

(75) Inventors: Takahiko Orita, Kawasaki (JP); Eiichi Konno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 483 days.

(21) Appl. No.: 12/222,229

(22) Filed: Aug. 5, 2008

(65) Prior Publication Data

US 2009/0125861 A1 May 14, 2009

(30) Foreign Application Priority Data

Nov. 12, 2007 (JP) ................................. 2007-293442

(51) Int. Cl.
*G06F 17/50* (2006.01)
(52) U.S. Cl. .................... 716/137; 716/102; 716/126
(58) Field of Classification Search .................. 716/100, 716/126, 137, 102, 119, 132
See application file for complete search history.

(56) References Cited

U.S. PATENT DOCUMENTS

| | | | | |
|---|---|---|---|---|
| 5,519,633 A * | 5/1996 | Chang et al. | .................. | 716/102 |
| 5,546,321 A * | 8/1996 | Chang et al. | .................. | 716/102 |
| 5,745,371 A * | 4/1998 | Shouen | .......................... | 716/102 |
| 5,787,268 A * | 7/1998 | Sugiyama et al. | ............ | 716/108 |
| 6,245,599 B1 * | 6/2001 | Goto et al. | ..................... | 438/129 |
| 6,629,305 B2 * | 9/2003 | Ito et al. | ......................... | 716/119 |
| 6,795,950 B2 * | 9/2004 | Matsushita et al. | ........... | 716/102 |
| 7,140,884 B2 * | 11/2006 | Brodsky et al. | ................. | 439/66 |
| 7,240,318 B2 * | 7/2007 | Ito et al. | ........................ | 716/112 |
| 7,454,736 B2 * | 11/2008 | Kitamura | ...................... | 716/132 |

FOREIGN PATENT DOCUMENTS

| | | |
|---|---|---|
| JP | 62-168269 | 7/1987 |
| JP | 63-129467 | 6/1988 |
| JP | 07-306886 | 11/1995 |
| JP | 07-311797 | 11/1995 |

* cited by examiner

*Primary Examiner* — Sun J Lin
(74) *Attorney, Agent, or Firm* — Staas & Halsey LLP

(57) ABSTRACT

A wiring design processing method is for designing an automatic wiring processing process as an execution sequence of various processing in automatic wiring processing for printed circuit boards by using a computer. The wiring design processing method includes storing, in a storage unit, printed circuit board information including various physical information regarding the printed circuit boards, for each of the printed circuit boards; creating an automatic wiring processing process automatically according to a result of analyzing setting, wiring progress, and wiring situation at present regarding each of the printed circuit boards, after reading the printed circuit board information, stored in the storage unit at the storing, for each of the printed circuit boards; and executing the automatic wiring processing according to the automatic wiring processing process created at the creating, for each of the printed circuit boards.

12 Claims, 14 Drawing Sheets

FIG.5

(1) NET INFORMATION

| SIGNAL NAME | THEORETICAL LENGTH |
|---|---|
| A | |
| B | |
| C | |
| ... | |

WIRING CONSTRAINING INFORMATION
   ISOMETRIC LENGTH
   GROUP: (A,B,C)
   ...

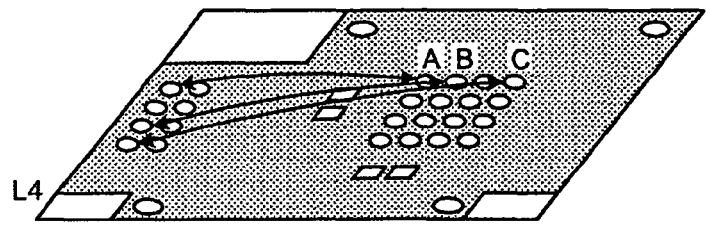

(2) NET INFORMATION

| SIGNAL NAME | THEORETICAL LENGTH |
|---|---|
| A | 200 |
| B | 300 |
| C | 400 |
| ... | |

WIRING CONSTRAINING INFORMATION
   ISOMETRIC LENGTH
   GROUP: (A,B,C)
   ...

(3) NET INFORMATION

| SIGNAL NAME | THEORETICAL LENGTH | |
|---|---|---|
| A | 400 | }  |
| B | 400 | ISOMETRIC LENGTH |
| C | 400 | |
| ... | | |

WIRING CONSTRAINING INFORMATION
   ISOMETRIC LENGTH
   GROUP: (A,B,C)
   ...

FIG.13

[AUTOMATIC WIRING PROCESSING PROCESS]

1: AUTOMATIC CREATION OF LAYER ASSIGNMENT
2: AUTOMATIC WIRING OF BUS GROUP
3: AUTOMATIC WIRING OF NET
   HAVING PAIR/DIFFERENTIATION PROPERTY
4: AUTOMATIC WIRING OF NET
   WHERE WIRING IS UNCOMPLETED
5: MITERING/SPACING

WIRING DESIGN PROCESSING METHOD AND WIRING DESIGN PROCESSING APPARATUS

BACKGROUND OF THE INVENTION

1. Field of the Invention

The present invention relates to a wiring design processing method by which an automatic wiring processing process or an execution sequence of various processing of automatic wiring processing for a printed circuit board is designed using a computer, a wiring design processing program, and a wiring design processing apparatus that correspond to the automatic wiring processing method.

2. Description of the Related Art

Large scale integrations (LSIs) are becoming larger in scale as well as signal speed thereof is becoming faster because LSIs are high-pin-count and a ball grid array (BGA) package is used for them conventionally. As a result, a period for design processing, such as component arranging processing and wiring processing, of a printed circuit board is prone to be extended. To address the problem, various technologies are proposed that assist automation of the design processing.

For example, in Japanese Patent Application Laid-open No. H7-306886, a technology is proposed in which a wiring program is created by assembling a wiring processing procedure prepared by evaluating routability as well as an arranging program is created by assembling a component arrangement processing procedure created according to arrangement controlling information. Then, a line between neighboring component pins is defined as a "string", and a wave created by a maze routing from the start point to the end point of a wiring route is spread between neighboring strings, and then, by traversing positions of the strings passed by the wave reaching from the start point to the end point, a wiring route for wiring using a wiring program is decided.

The conventional technology, however, is problematic in that a design processing period of a printed circuit board can not be reduced. More specifically, in the conventional technology the design processing period can not be reduced as a matter of fact, because the conventional technology depends largely on manual work, for example, a wiring processing process of a printed circuit board must be manually designed by a designer.

SUMMARY

It is an object of the present invention to at least partially solve the problems in the conventional technology.

According to an aspect of the present invention, a wiring design processing method is for designing an automatic wiring processing process as an execution sequence of various processing in automatic wiring processing for printed circuit boards by using a computer. The wiring design processing method includes storing, in a storage unit, printed circuit board information including various physical information regarding the printed circuit boards, for each of the printed circuit boards; creating an automatic wiring processing process automatically according to a result of analyzing setting, wiring progress, and wiring situation at present regarding each of the printed circuit boards, after reading the printed circuit board information, stored in the storage unit at the storing, for each of the printed circuit boards; and executing the automatic wiring processing according to the automatic wiring processing process created at the creating, for each of the printed circuit boards.

According to another aspect of the present invention, a computer program product causes a computer to perform the method according to the present invention.

According to still another aspect of the present invention, a wiring design processing apparatus is for designing an automatic wiring processing process as an execution sequence of various processing in automatic wiring processing for printed circuit boards by using a computer. The wiring design processing method includes a storage unit that stores therein printed circuit board information including various physical information regarding the printed circuit boards, for each of the printed circuit boards; a process creating unit that creates an automatic wiring processing process automatically according to a result of analyzing setting, wiring progress, and wiring situation at present regarding each of the printed circuit boards, after reading the printed circuit board information, stored in the storage unit at the storing, for each of the printed circuit boards; and a automatic wiring processing unit that executes the automatic wiring processing according to the automatic wiring processing process created by the creating unit, for each of the printed circuit boards.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a schematic for explaining calculation of a total theoretical wiring length according to the first embodiment;

FIG. 13 is a schematic of an example of information displaying an automatic wiring processing process shown in FIG. 12;

DETAILED DESCRIPTION OF THE PREFERRED EMBODIMENTS

Referring to the attached drawings, exemplary embodiments of a wiring design processing method, a wiring design processing program, and a wiring design processing apparatus of the present invention will be described in detail below. A wiring design processing apparatus that implements a wiring design processing method as an embodiment of a wiring design processing method of the present invention will be described as a first embodiment, then another embodiment that implements the present invention will be described as another embodiment.

In the first embodiment, an overview and features of a wiring design processing apparatus according to the first embodiment will be described first. Then, configuration and processing of the wiring design processing apparatus will be described one by one. At the end, advantages of the first embodiment will be described.

Figure 1:
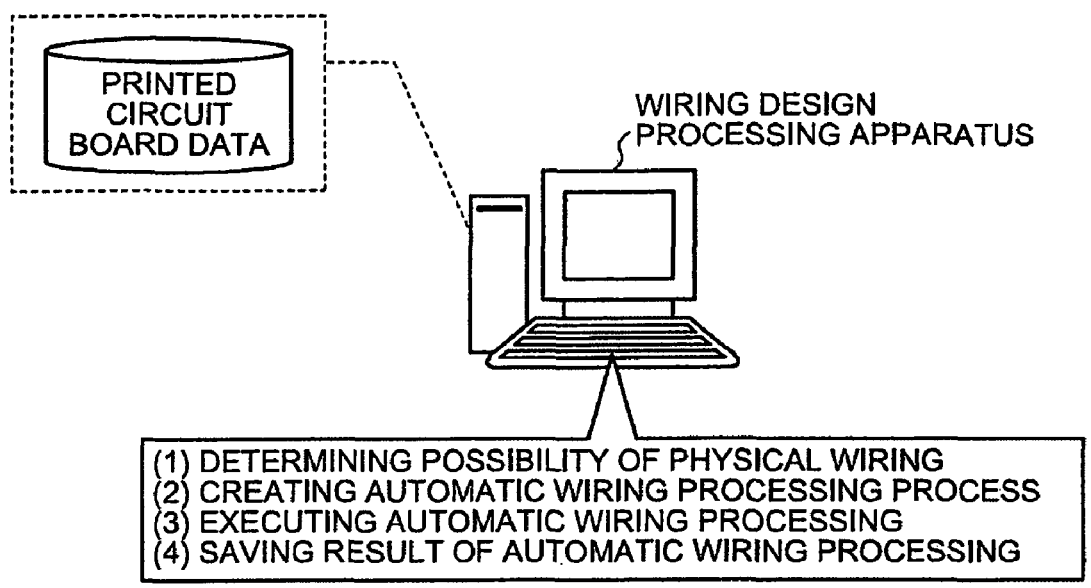
FIG. 1 is a schematic of an overview and features of a wiring design processing apparatus according to a first embodiment of the present invention.

Referring to FIG. 1, an overview and features of the wiring design processing apparatus according to the first embodiment will be described first. FIG. 1 is a schematic of an overview and features of the wiring design processing apparatus according to the first embodiment.

The wiring design processing apparatus according to the first embodiment generally is to design an automatic wiring processing process indicating an execution sequence of various processing of automatic wiring processing for a printed circuit board. More specifically, a main feature of the wiring design processing apparatus is that a design processing period can be reduced without depending on manual work in design processing of a printed circuit board.

Specifically, the wiring design processing apparatus according to the first embodiment stores therein printed circuit board information including various physical information regarding the printed circuit board for each printed circuit board, as shown in FIG. 1. The wiring design processing apparatus according to the first embodiment stores therein, as printed circuit board information, necessary information for automatic wiring processing of a printed circuit board, such as circuit board information, component information, component pin information, wiring route information, wiring (line) information, design specification layer information, design specification wiring control information, net information, and wiring constraining information.

The wiring design processing apparatus according to the first embodiment determines if automatic wiring processing can be performed physically according to printed circuit board data (see (1) in FIG. 1). More specifically, if automatic wiring can be performed physically is determined according to information such as circuit board size that can be referred to from the circuit board information, the number of layers in the circuit board that can be referred to from the design specification layer information, component arrangement that can be referred to from the component information, and constraining condition name that can be referred to from the wiring constraining information.

Figure 2:
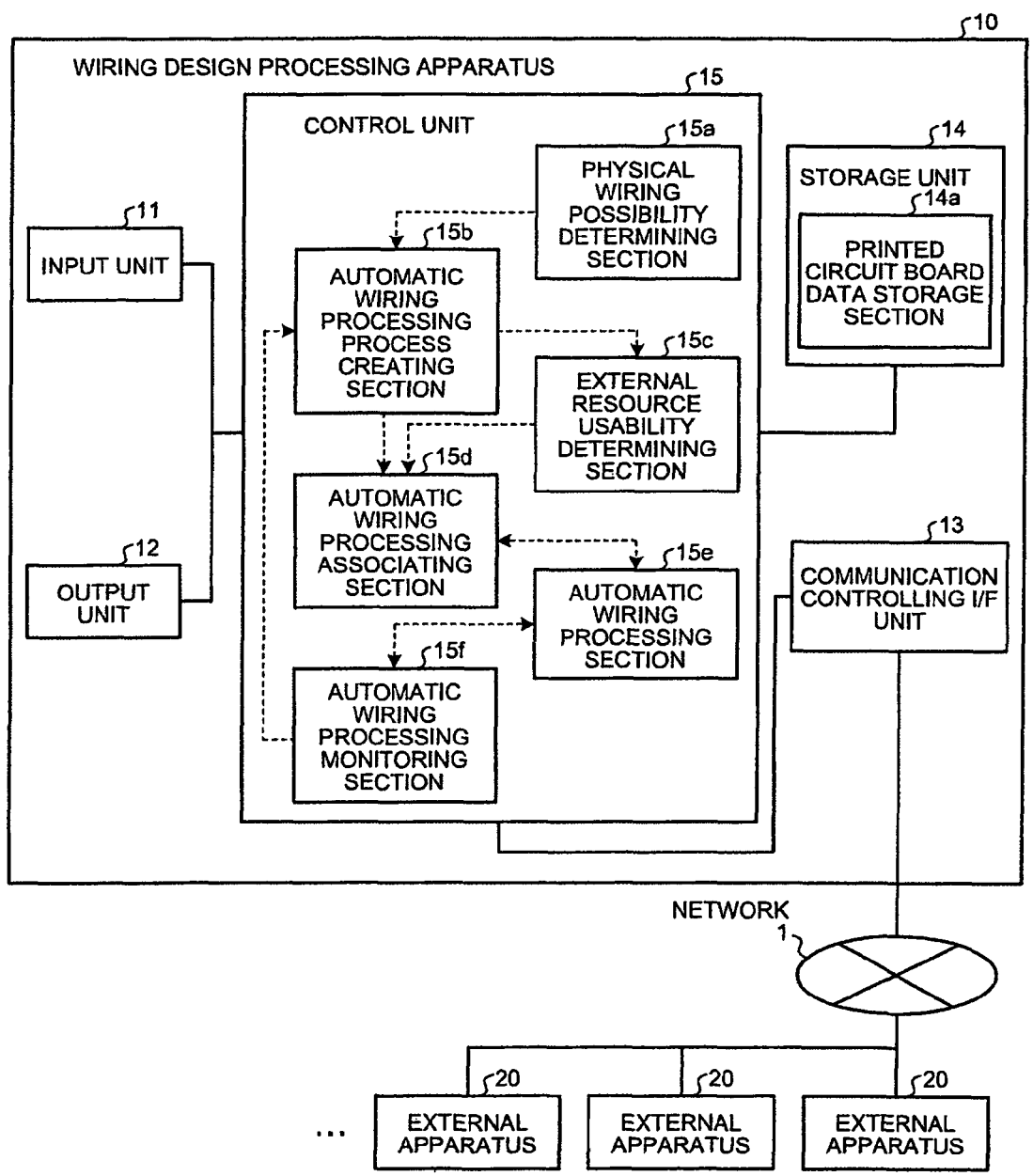
FIG. 2 is a block diagram of the wiring design processing apparatus shown in FIG. 1.

If a result of the determination shows that the automatic wiring processing can be performed physically, the wiring design processing apparatus according to the first embodiment automatically creates an automatic wiring processing process indicating an execution sequence of various processing in automatic wiring processing of a printed circuit board (see (2) in FIG. 2). More specifically, an automatic wiring processing process is automatically created according to a result of analyzing settings (for example, setting of a route layer that denotes a layer where wiring is performed), wiring progress (for example, information showing if lead wiring or wiring of the same bus group is completed), and wiring situation (for example, information showing if there is enough mitering or spacing for wiring) at present regarding each printed circuit board, by reading printed circuit board information for each printed circuit board.

After the automatic wiring processing process is created, the wiring design processing apparatus according to the first embodiment performs automatic wiring processing according to the automatic wiring processing process (see (3) in FIG. 1), and saves an automatic wiring processing result (see (4) in FIG. 1).

Thus, the wiring design processing apparatus according to the first embodiment can reduce a design processing period of a printed circuit board, as the main feature described above.

Figure 3:
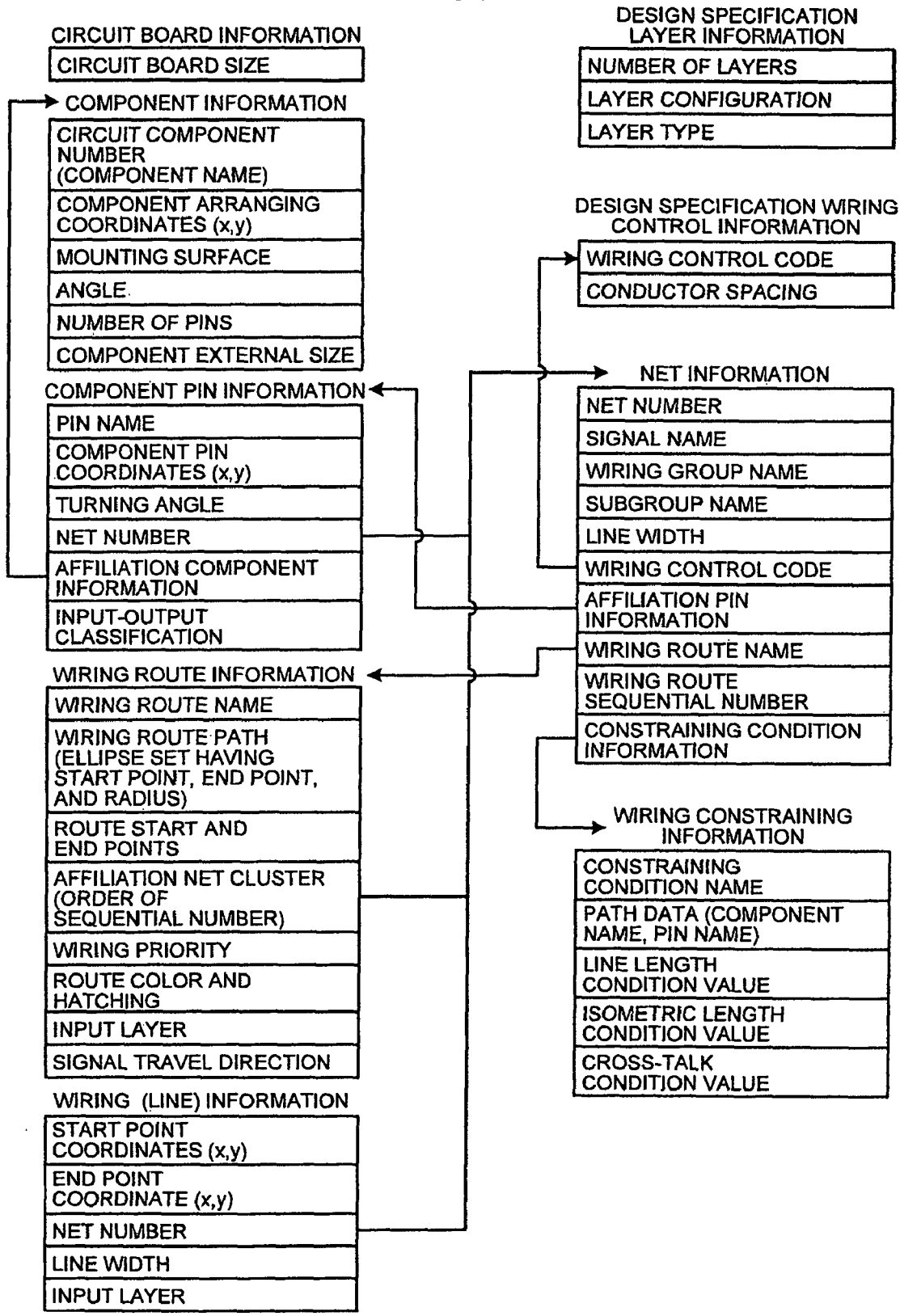
FIG. 3 is a schematic of an example of configuration of printed circuit board data according to the first embodiment.
Figure 4:
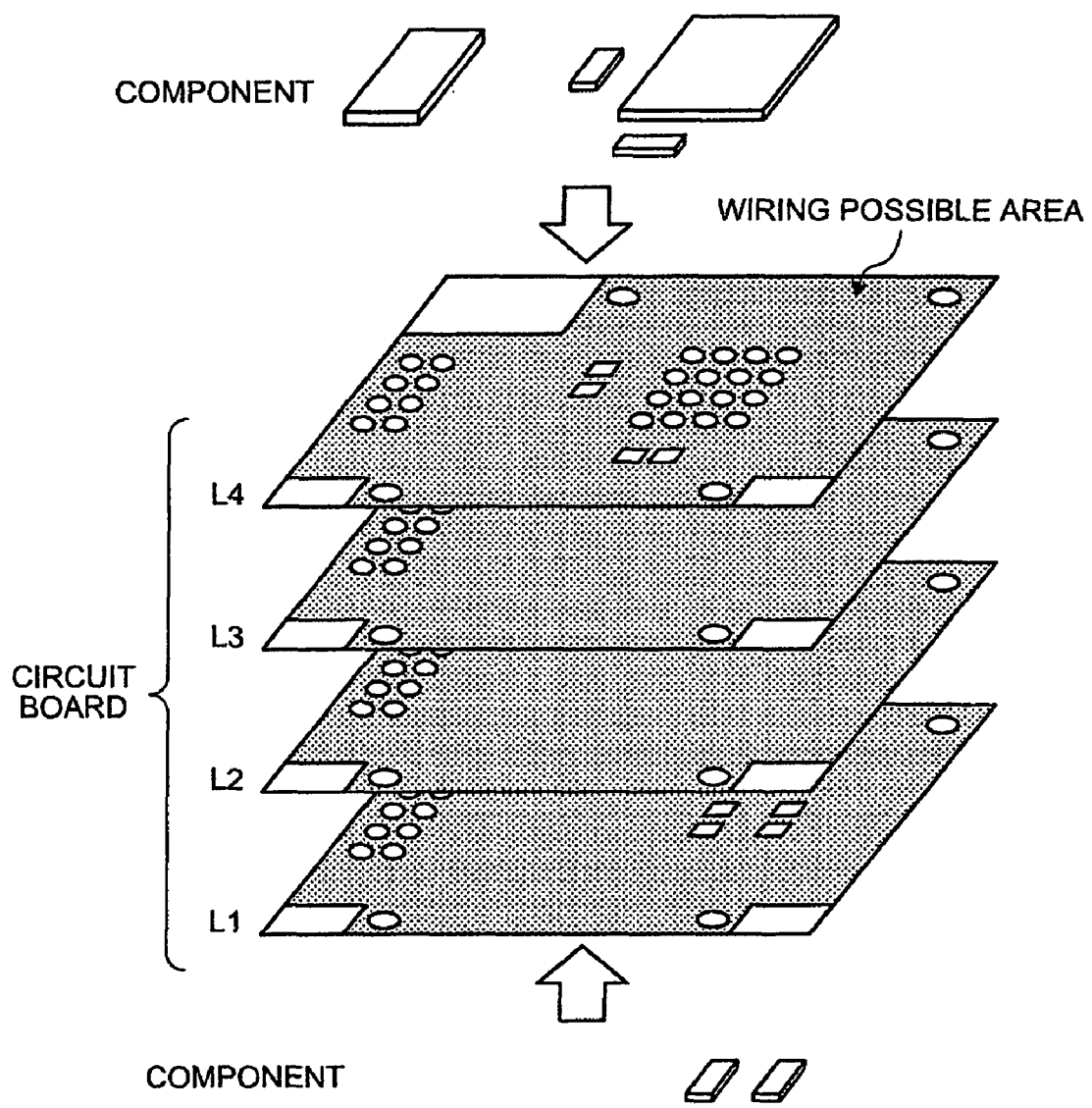
FIG. 4 is a schematic for explaining calculation of a wiring possible area according to the first embodiment.
Figure 6:
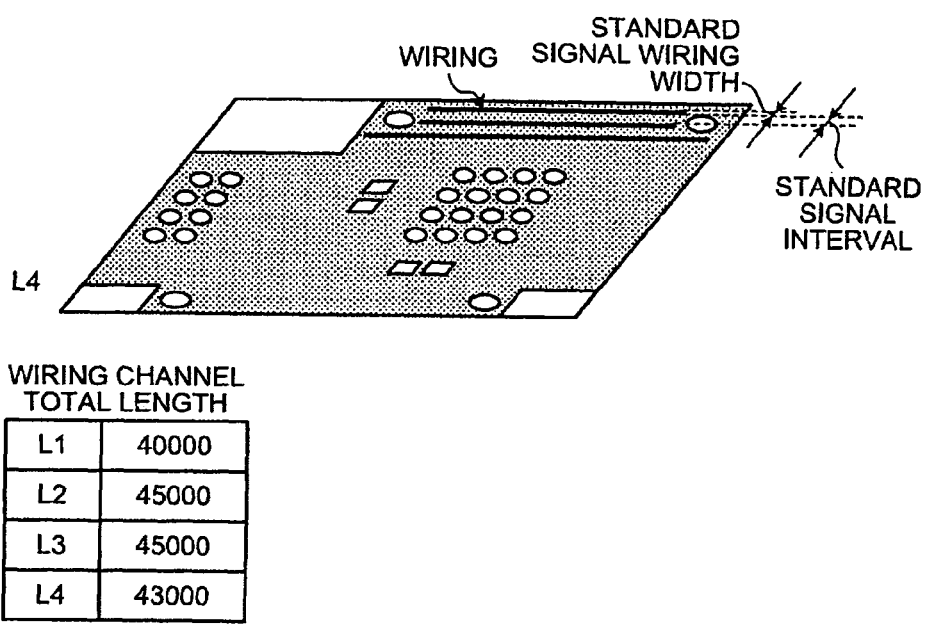
FIG. 6 is a schematic for explaining calculation of a wiring channel total length according to the first embodiment.
Figure 7:
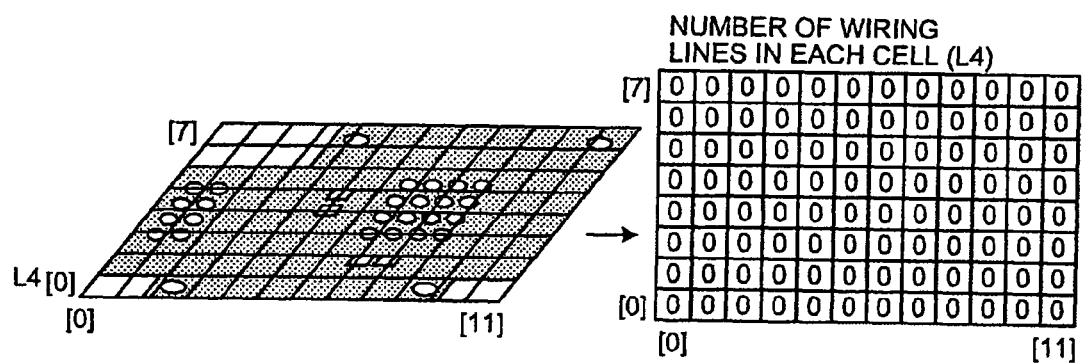
FIG. 7 is a schematic of initial value settings of the number of wiring lines passing through each of the cells according to the first embodiment.
Figure 8:
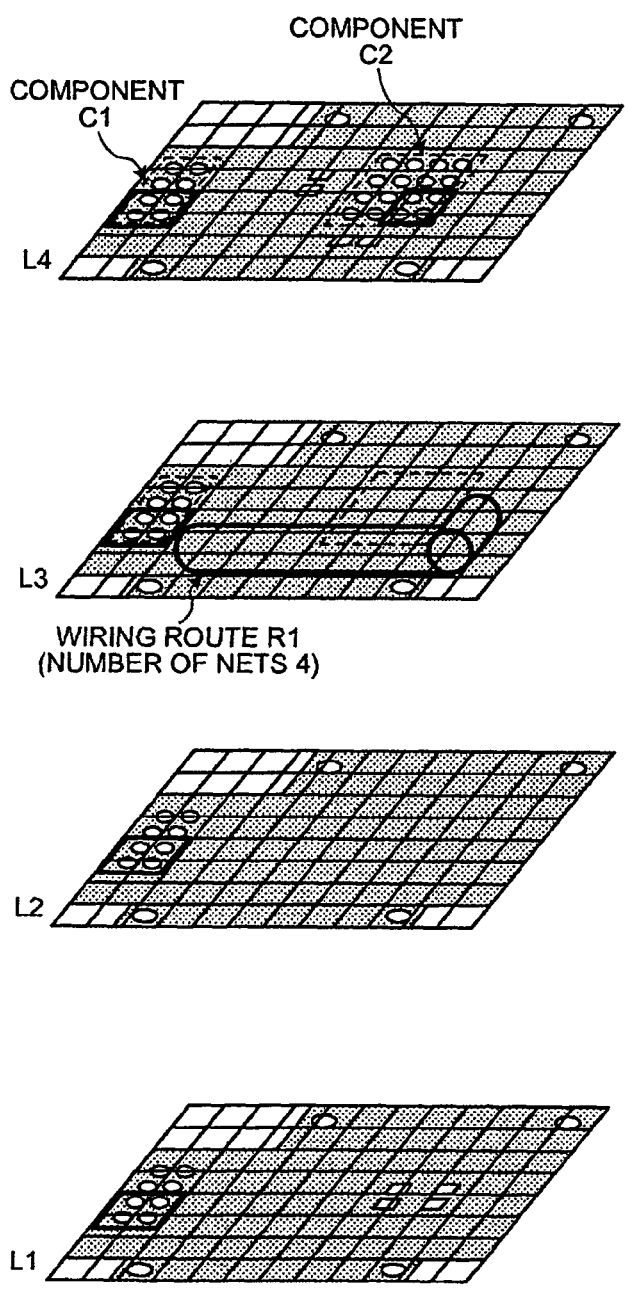
FIG. 8 is a schematic for explaining counting of the number of wiring route setting net wiring lines.
Figure 9:
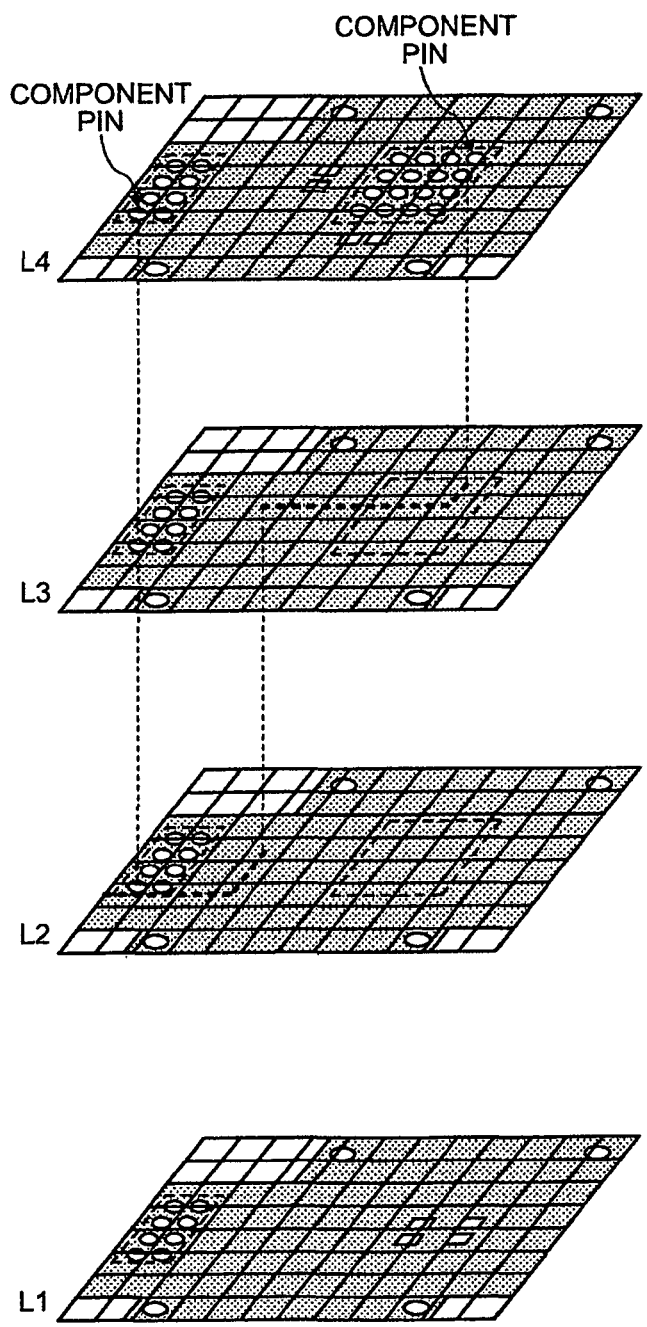
FIG. 9 is a schematic for explaining counting of the number of wiring lines when no wiring route is set.

Referring to FIGS. 2 to 9, configuration of the wiring design processing apparatus according to the first embodiment will be described. FIG. 2 is a block diagram of configuration of the wiring design processing apparatus according to the first embodiment. FIG. 3 is a schematic of an example of configuration of printed circuit board data according to the first embodiment. FIG. 4 is a schematic for explaining how to calculate a wiring possible area according to the first embodiment. FIG. 5 is a schematic for explaining how to calculate a total theoretical wiring length according to the first embodiment. FIG. 6 is a schematic for explaining how to calculate a wiring channel total length according to the first embodiment. FIG. 7 is a schematic of initial value settings of the number of wiring lines passing through each cell. FIG. 8 is a schematic for explaining how to calculate the number of wiring route setting net wiring lines according to the first embodiment. FIG. 9 is a schematic for explaining how to calculate the number of wiring lines when no wiring route is set according to the first embodiment.

As shown in FIG. 2, the wiring design processing apparatus 10 according to the first embodiment is communicatably connected to an external apparatus 20 via a network 1, and includes an input unit 11, an output unit 12, a communication control I/F unit 13, a storage unit 14, and a control unit 15.

Among these units, the input unit 11 receives inputs of various information, and includes a keyboard, a mouse, and a microphone. The input unit 11 receives, for example, an input of modification of an automatic wiring processing process.

The output unit 12 outputs various information, and includes a monitor (alternatively, a display or a touch panel) and a speaker. The output unit 12 outputs, for example, an automatic wiring processing process that is created automatically or automatic wiring processing situation in real time. When the output unit 12 includes a monitor, the output unit 12 cooperates with the mouse included in the input unit 11 to implement a pointing device function.

The communication control I/F unit 13 controls communication of various information transmitted to and from the external apparatus 20 via the network 1.

The storage unit 14 is a storage unit that stores therein data and program necessary for various processing by the control unit 15, and includes a printed circuit board data storage section 14a, which is closely related to the present invention.

The printed circuit board data storage section 14a stores therein printed circuit board information including various physical information thereof for each printed circuit board. More specifically, the printed circuit board data storage section 14a stores therein, as printed circuit board information, information necessary for automatic wiring processing of a printed circuit board, such as circuit board information, component information, component pin information, wiring route information, wiring (line) information, design specification layer information, design specification wiring control information, net information, and wiring constraining information.

The circuit board information includes circuit board size. The component information includes circuit component number (component name), component arranging coordinates, mounting surface, angle, pin number, and component external size. The component pin information includes, pin names, component pin coordinates, turning angles, net numbers, affiliation component information, and input-output classifications. The design specification layer information includes the number of layers, layer configuration, and layer type. The design specification wiring control information includes wiring control code and conductor spacing. The net information includes net number, signal name, wiring group name, subgroup name, wiring width, wiring control code, affiliation pin information, wiring route name, wiring route serial number, and constraining condition information. The wiring constraining information includes constraining condition name, path data (component name and pin name), wiring length condition value, isometric length condition value, and cross-talk condition value. The wiring (line) information includes start point coordinates, end point coordinates, net number, wiring width, and input layer.

Some of data stored in the printed circuit board data storage section 14a are linked to each other, and various information can be identified by tracking the link.

The control unit 15 is a processing unit having an internal memory that stores therein a predetermined controlling program, a program that defines various processing procedures, and necessary data, and includes a physical wiring possibility determining section 15a, an automatic wiring processing process creating section 15b, an external resource usability determining section 15c, an automatic wiring processing associating section 15d, an automatic wiring processing section 15e, and an automatic wiring processing monitoring section 15f, which are closely related to the present invention.

The physical wiring possibility determining section 15a is a processing unit that determines if automatic wiring processing is physically executable, according to the printed circuit board data. More specifically, the physical wiring possibility determining section 15a executes physical wiring channel shortage determining processing and local channel neck determining processing for determining if automatic wiring can be physically executed, according to information such as a circuit board size that can be referred to from circuit board information contained in the printed circuit board data, the number of layers in the circuit board that can be referred to from design specification layer information, component arrangement that can be referred to from component information, and constraining condition name that can be referred to from wiring constraining information.

Physical wiring channel shortage determining processing and local channel neck determining processing by the physical wiring possibility determining section 15a will be described in detail below. The physical wiring channel shortage determining processing will be described first. The physical wiring possibility determining section 15a calculates a wiring possible area for each layer, for example L1 to L4, that constitutes the printed circuit board, according to information such as a circuit board size (circuit board shape and an area of the circuit board), the number of layers in the circuit board, component arrangement, and wiring constraining condition, read from the printed circuit board data storage section 14a (see FIG. 4).

Then, the physical wiring possibility determining section 15a calculates a theoretical length of Manhattan length for each layer, for each signal contained in the net information that is read from the printed circuit board data storage section 14a (see (1) and (2) in FIG. 5). Thus, the physical wiring possibility determining section 15a corrects theoretical lengths that are calculated for each signal in each layer, according to wiring constraining information (such as isometric length condition value and isometric length group) that is read from the printed circuit board data storage section 14a. After correcting the theoretical lengths, the physical wiring possibility determining section 15a calculates a total theoretical length by calculating the sum total of theoretical lengths that are calculated for each layer (see (3) in FIG. 5).

The physical wiring possibility determining section 15a then calculates a wiring length for each layer when a routable area is filled with wiring, according to the net information (for example, standard signal line width and standard signal interval) that is read from the printed circuit board data storage section 14a (see FIG. 6). Then, the physical wiring possibility determining section 15a calculates a wiring channel total length by calculating the sum total of wiring lengths calculated for each layer.

After the calculation of the total theoretical wiring length and the wiring channel total length, the physical wiring possibility determining section 15a determines if the physical wiring channel capacity is insufficient, by comparing the total theoretical wiring length with the wiring channel total length. After comparing the total theoretical wiring length with the wiring channel total length, the physical wiring possibility determining section 15a determines that the physical wiring channel capacity is insufficient when the total theoretical wiring length is greater than the wiring channel total length, then terminates the automatic wiring processing because of the insufficient physical wiring channel capacity.

As a result of the comparison of the total theoretical wiring length and the wiring channel total length, the physical wiring possibility determining section 15a determines that the physical wiring channel capacity is sufficient when the wiring channel total length is greater than the total theoretical wiring length, and goes on to local channel neck determining processing.

When going on to the local channel neck determining processing, the physical wiring possibility determining section 15a sets, at an initial value ("0"), the number of wiring lines that pass through each cell into which each of layers of the printed circuit board is divided evenly in a grid pattern (see FIG. 7). If wiring lines exist already, the number of wiring lines should be calculated in cells through which the wiring lines pass.

The physical wiring possibility determining section 15a calculates the number of wiring lines that pass through each cell for each net. More specifically, the physical wiring possibility determining section 15a refers to wiring route information that is read from the printed circuit board data storage section 14a, and if counting is performed in a net where wiring routes are set, for example, as shown in FIG. 8, in a layer L3 where a wiring route R1 having the number of nets "4" that connects pins of components C1 and C2, counting of the number of wiring lines that pass through each cell for each net is performed (for example, in a certain cell in the layer L3, counting of the number of wiring lines "2" is performed).

If the physical wiring possibility determining section 15a performs counting in a net where a wiring path is not set yet, counting of the number of wiring lines that pass through each cell for each net is performed (for example, counting of the numbers of wiring lines "2" and "1" in certain cells in the layer L3, and counting of the number of wiring line "1" in a certain cell in the layer L2 are performed), under the condition that, for example, as shown in FIG. 9, the component pins are connected by Manhattan and layers are switched (switched from the layer L2 to the layer L3) so that the number of wiring lines that pass through each cell is the smallest.

After the counting of the number of wiring lines that pass through each cell for each net, the physical wiring possibility determining section 15a determines if there is a local channel neck by comparing the number of cells where the number of the counted wiring lines is above the number of wiring lines that can be housed therein with a set value that is set in advance by a user for each cell. When it is determined that the number of cells where a number of counted wiring lines is above the number of wiring lines that can be housed therein is above the set value set by the user, it is determined that there is a local channel neck, and thus the processing is terminated because automatic wiring processing is physically impossible.

However, when the physical wiring possibility determining section 15a determines that the number of cells where the number of counted wiring lines is above the number of wiring lines that can be housed therein is not above the set value set by the user, it is determined that there is not a local channel neck, and the physical wiring possibility determining section 15a goes on to automatic wiring processing process creating processing in the automatic wiring processing process creating section 15b.

The automatic wiring processing process creating section 15b is a processing unit that automatically creates an automatic wiring processing process or an execution sequence of various processing in automatic wiring processing of the printed circuit board.

More specifically, the automatic wiring processing process creating section 15b automatically creates an automatic wiring processing process, according to a result of analyzing the settings (for example, setting of a route layer that denotes a layer where wiring is performed), wiring progress (for example, information showing if lead wiring or wiring of the same bus group is completed), and wiring situation (for example, information showing if there is enough mitering or spacing for wiring) at present regarding each printed circuit board, by reading printed circuit board data for each printed circuit board from the printed circuit board data storage section 14a.

After the automatic wiring processing process is created, the automatic wiring processing process creating section 15b outputs and displays the automatic wiring processing process thus created in the output unit 12, thereby providing the same to the user. When receiving a modifying instruction of an automatic wiring processing process from the user, the automatic wiring processing process creating section 15b corrects the automatic wiring process according to the modifying instruction from the user, and transmits the same to the automatic wiring processing associating section 15d that will be described below. When receiving an approving instruction of the automatic wiring process from the user, however, the automatic wiring processing process creating section 15b transmits the automatic wiring processing process thus created to the automatic wiring processing associating section 15d without any additional processing.

When the automatic wiring processing process creating section 15b receives, from the user, modification of an execution sequence of various processing in the automatic wiring processing that is not completed while the automatic wiring processing section 15e performs the automatic wiring processing, the automatic wiring processing process creating section 15b creates, according to the modification of the execution sequence received from the user, an automatic wiring processing process for various processing that is not completed, and transmits the same to the automatic wiring processing associating section 15d that will be described below.

When the automatic wiring processing process creating section 15b receives a re-creating instruction of the automatic wiring processing process from the automatic wiring processing monitoring section 15f that will be described below while the automatic wiring processing section 15e performs the automatic wiring processing, the automatic wiring processing process creating section 15b re-creates an automatic wiring processing process that consists of an execution sequence other than the execution sequence of the previous processing. Then, the automatic wiring processing process creating section 15b transmits the same to the automatic wiring processing associating section 15d that will be described below.

The automatic wiring processing process creating section 15b not only re-creates an automatic wiring processing process by modifying an execution sequence of various processing in automatic wiring processing of a printed circuit board, but may re-create an automatic wiring process to execute various processing in an automatic wiring processing, also by modifying types of a plurality of algorithms (for example, a layer assignment automatic creating algorithm and a lead wiring executing algorithm) that exist for each processing without modifying an execution sequence of various processing. An automatic wiring process may also be re-created both by modifying an execution sequence of various processing in automatic wiring processing of a printed circuit board and by modifying a type of the algorithms to execute various processing in an automatic wiring processing.

The external resource usability determining section 15c is a processing unit that determines if the external apparatus 20 should be utilized when automatic wiring processing is executed. More specifically, when the automatic wiring processing process creating section 15b completes creation of an automatic wiring processing process before executing automatic wiring processing, the external resource usability determining section 15c refers to printed circuit board data stored in the printed circuit board data storage section 14a and calculates load required for automatic wiring processing according to information such as a circuit board size and the number of nets. When the load thus calculated is so heavy that the wiring design processing apparatus cannot execute the processing by itself, the external resource usability determining section 15c determines that the external apparatus 20 should be utilized.

The automatic wiring processing associating section 15d is a processing unit that associates the automatic wiring process created by the automatic wiring processing process creating section 15b with the automatic wiring processing section 15e. More specifically, the automatic wiring processing associating section 15d associates the automatic wiring processing process received from the automatic wiring processing process creating section 15b with printed circuit board data that is utilized when various processing is performed according to the automatic wiring processing process, and transmits the same to the automatic wiring processing section 15e.

The automatic wiring processing associating section 15d prepares an application in the external apparatus 20 as well as associates the automatic wiring processing process for executing the automatic wiring processing in the external apparatus 20 with the printed circuit board data, and transmits the same to the external apparatus 20, when the external resource usability determining section 15c determines that the external apparatus 20 should be utilized.

The automatic wiring processing section 15e is a processing unit that executes an automatic wiring processing according to an automatic wiring processing process when the automatic wiring processing monitoring section 15f described below starts the automatic processing process created by the automatic wiring processing process creating section 15b. The automatic wiring processing section 15e can execute process concurrently that does not interfere with each other, such as automatic wiring processing on regions that are separated on the printed circuit board and automatic wiring processing on different layers.

The automatic wiring processing monitoring section 15f is a processing unit that monitors automatic wiring processing executed by the automatic wiring processing section 15e, collects historical information showing how the automatic wiring processing progresses for each evaluation item for evaluating the situation of the automatic wiring processing (for example, an elapsed time from the beginning of the processing, a wiring ratio and a fluctuation rate thereof at a certain time after the beginning of the processing, the number of wiring errors, and resource condition of devices such as a central processing unit (CPU) and a memory), and executes a monitoring action according to the collected historical information.

More specifically, the automatic wiring processing monitoring section 15f compares each threshold, such as threshold set as default or by the user, that is set in advance for each evaluation item with each piece of historical information collected at the monitoring, and executes a monitoring action for each evaluation item according to the result of the comparison.

For example, when a wiring ratio after a certain time is not above the threshold, or when the number of wiring errors is above the threshold, the automatic wiring processing monitoring section 15f transmits a suspending instruction to the automatic wiring processing section 15e so that the automatic wiring processing is suspended, as well as decides to re-create an automatic wiring processing process and transmits a re-creating instruction of the automatic wiring processing process to the automatic wiring processing process creating section 15b.

When an elapsed time from the beginning of the automatic wiring processing is above the threshold, the automatic wiring processing monitoring section 15f transmits a terminating instruction to the automatic wiring processing section 15e so that the automatic wiring processing is terminated. The automatic wiring processing monitoring section 15f may notify to the user an elapsed time from the beginning of the automatic wiring processing or fluctuation of processing situation (for example, increase of wiring ratio or of the number of wiring errors).

When receiving an interrupt for suspending the automatic wiring processing from the user, the automatic wiring processing monitoring section 15f transmits a suspending instruction to the automatic wiring processing section 15e so that the automatic wiring processing is suspended. Then, when receiving from the user modification of wiring that is completed in the automatic wiring processing, the automatic wiring processing monitoring section 15f decides to restart automatic wiring processing in the condition where the completed wiring is modified, and transmits a processing restarting instruction to the automatic wiring processing section 15e so that automatic wiring processing is restarted in the condition where the modification of wiring by the user is reflected therein.

The automatic wiring processing monitoring section 15f outputs and displays the situation of the automatic wiring processing in running in real time on the output unit 12, and notifies the same to the user.

The automatic wiring processing monitoring section 15f may execute a monitoring action that is associated with some evaluation items, not only when each threshold (such as a threshold of a default setting and a threshold set by the user) associated with each evaluation item and set in advance is compared with each historical information collected at the monitoring, and according to the result of the comparison the automatic wiring processing monitoring section 15f executes a monitoring action associated with each evaluation item. For example, when a wiring ratio after a certain time is not above a threshold therefor and when the number of wiring errors is above a threshold therefor, the automatic wiring processing monitoring section 15f may transmit a suspending instruction to the automatic wiring processing section 15e so that the automatic wiring processing is suspended, as well as may decide to re-create an automatic wiring processing process and may transmit a re-creating instruction of the automatic wiring processing process to the automatic wiring processing process creating section 15b.

The wiring design processing apparatus 10 can be implemented by mounting various functions described above on an information processing device such as a known personal computer or a workstation. An information processing device such as a known personal computer or a workstation can also be utilized for the external apparatus 20.

Figure 10:
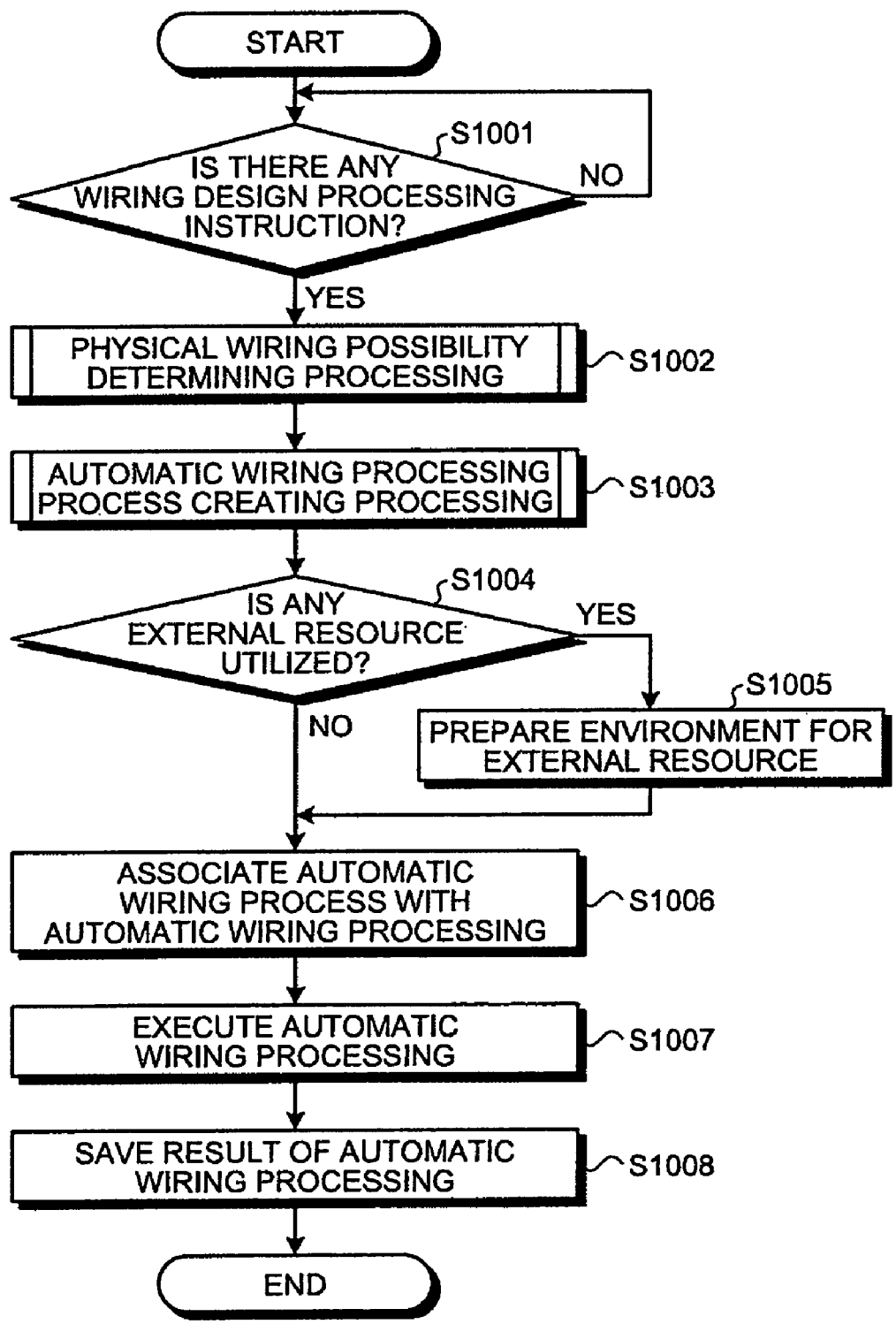
FIG. 10 is a flowchart of a wiring design processing according to the first embodiment.
Figure 11:
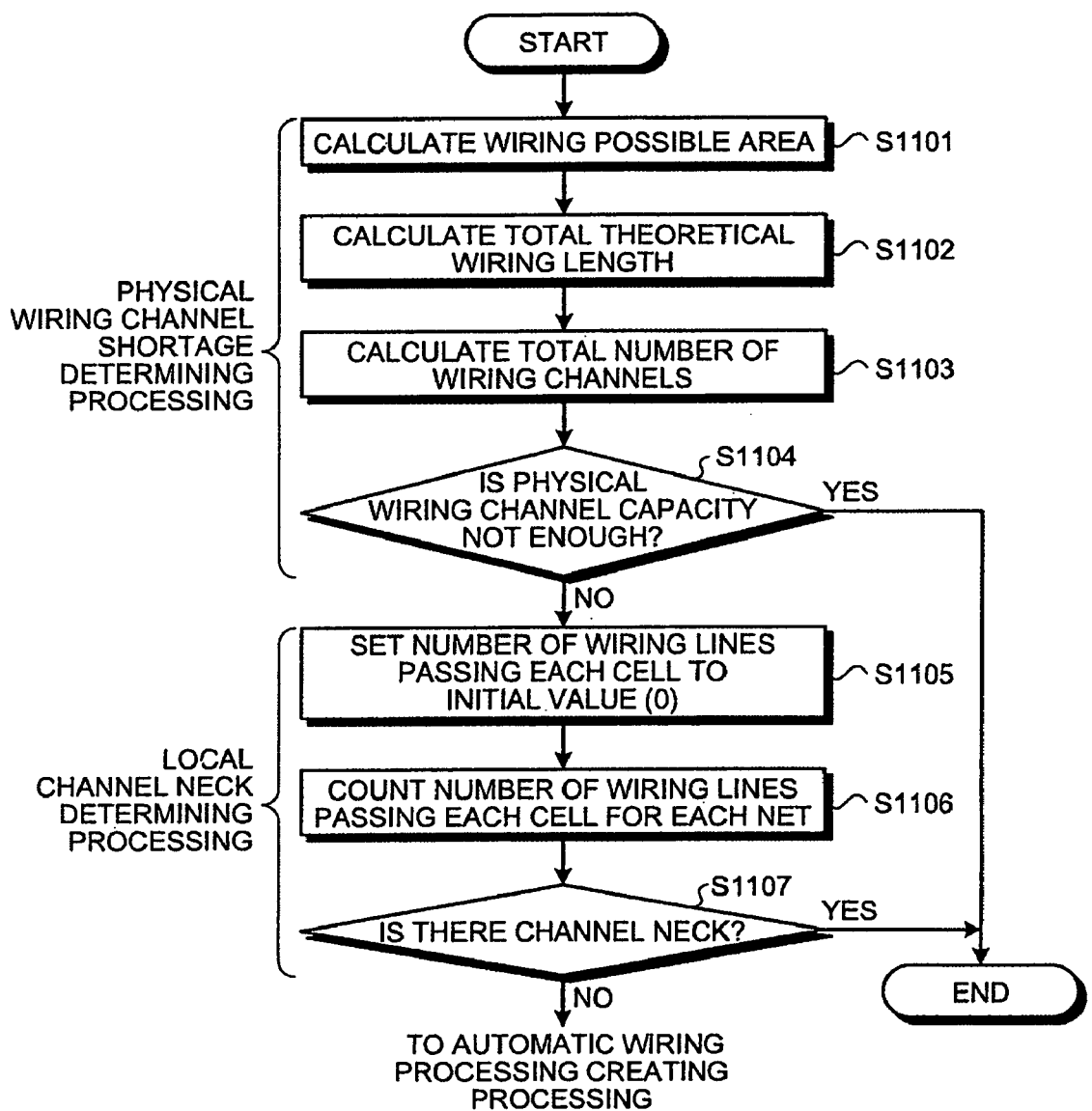
FIG. 11 is a flowchart of physical wiring possibility determining processing shown in FIG. 10.
Figure 12:
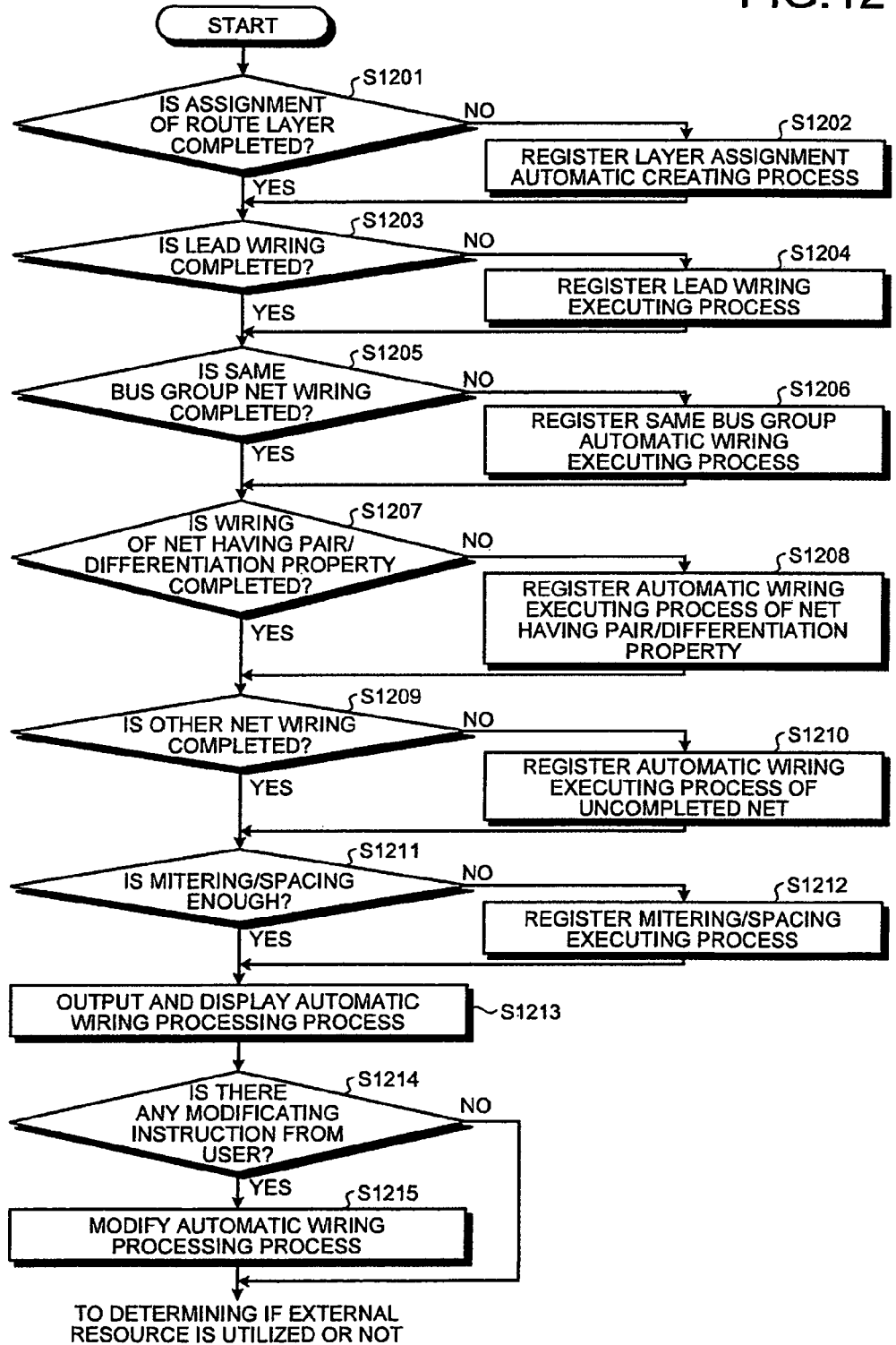
FIG. 12 is a flowchart of automatic wiring processing process creating processing shown in FIG. 10.
Figure 14:
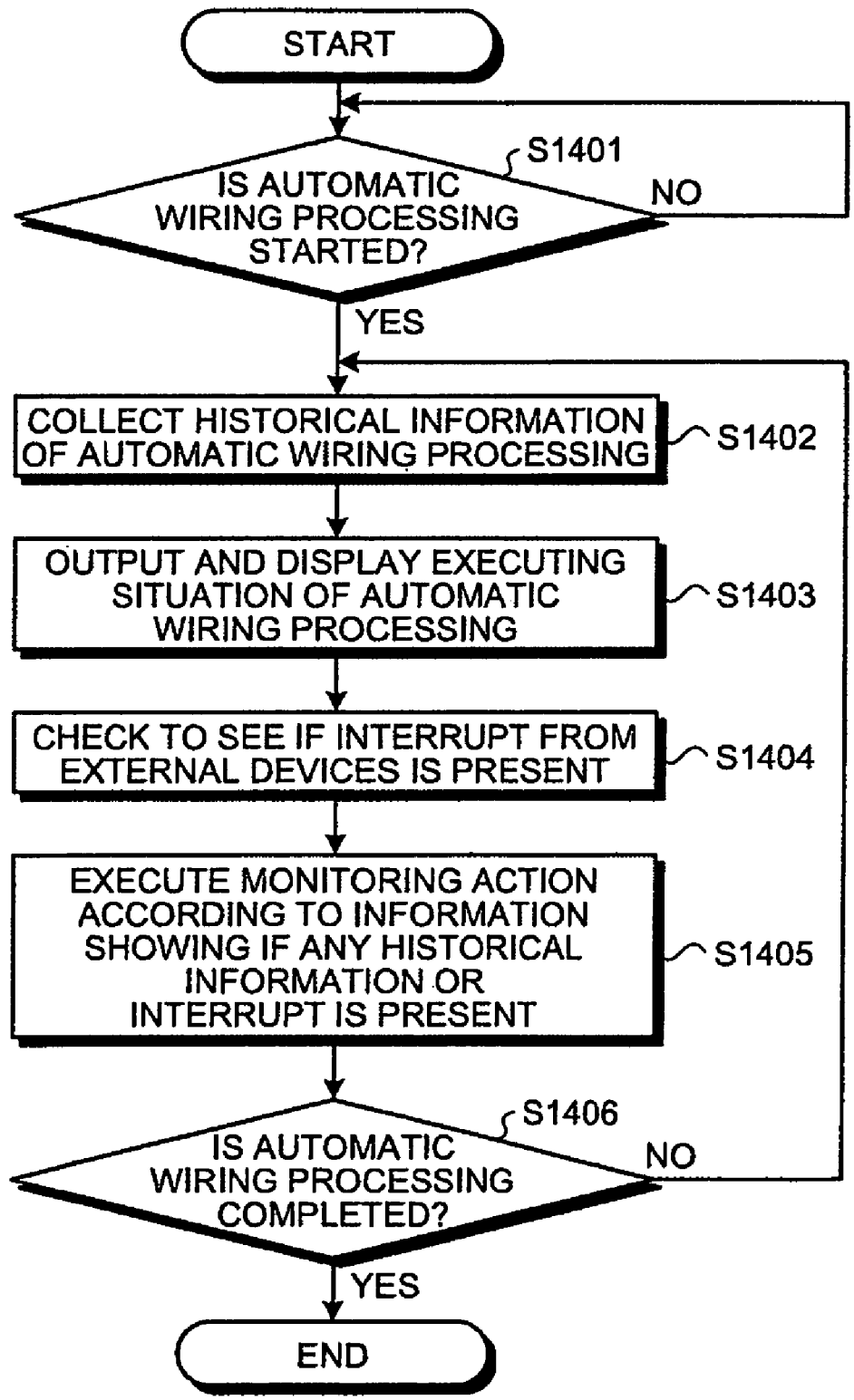
FIG. 14 is a flowchart of monitoring action processing according to the first embodiment.

Processing performed by the wiring design processing apparatus according to the first embodiment is described below with reference to FIGS. 10 to 14. FIG. 10 is a flowchart of the wiring design processing shown in FIG. 1. FIG. 11 is a flowchart of the physical wiring possibility determining processing shown in FIG. 10. FIG. 12 is a flowchart of the automatic wiring processing process creating processing shown in FIG. 10. FIG. 13 is a schematic of an example of displaying an automatic wiring processing process shown in FIG. 10. FIG. 14 is a flowchart of the monitoring action processing according to the first embodiment.

A flow of the wiring design processing according to the first embodiment will be described with reference to FIG. 10. As shown in FIG. 10, when receiving a wiring design processing instruction from the user (YES at Step S1001), the wiring design processing apparatus 10 executes physical wiring possibility determining processing (Step S1002). When the physical wiring possibility determining processing is completed, the wiring design processing apparatus 10 executes automatic wiring processing process creating processing (Step S1003).

The wiring design processing apparatus 10 determines if an external resource should be utilized (Step S1004). More specifically, when creation of the automatic wiring processing process before executing the automatic wiring processing is completed by the automatic wiring processing process creating processing, the external resource usability determining section 15c of the wiring design processing apparatus 10 refers to the printed circuit board data and then calculates load required for the automatic wiring processing according to information such as a circuit board size or the number of nets. When the load thus calculated is so big that the wiring design processing apparatus 10 cannot execute the processing by itself, the external resource usability determining section 15c determines that the external apparatus 20 should be utilized.

When it is determined that external resource (the external apparatus 20) is utilized (YES at Step S1004), the wiring design processing apparatus 10 prepares environment for the external resource (the external apparatus 20). More specifically, the automatic wiring processing associating section 15d of the wiring design processing apparatus 10 prepares an application in the external apparatus 20.

When preparation of the environment of the external resource (the external apparatus 20) is completed, or when it is determined that the external resource is not utilized (NO at Step S1004), the wiring design processing apparatus 10 associates the automatic wiring process created by the automatic wiring processing process creating processing with the automatic wiring processing (Step S1006). More specifically, the automatic wiring processing associating section 15d of the wiring design processing apparatus 10 associates the automatic wiring processing process created by the automatic wiring processing process creating processing with printed circuit board data utilized when various processing according to the automatic wiring processing process, and associates the same to the automatic wiring processing. Similarly, automatic wiring processing process for executing automatic wiring processing in the external apparatus 20 is associated with printed circuit board data, and transmitted to the external apparatus 20.

The wiring design processing apparatus 10 executes automatic wiring processing according to the automatic wiring processing process (Step S1007). When the automatic wiring processing is completed, the wiring design processing apparatus 10 saves a result of the automatic wiring processing (Step S1008).

A flow of the physical wiring possibility determining processing will be described with reference to FIG. 11. The physical wiring possibility determining section 15a executes the processing for each printed circuit board in the sequence described below. As shown in FIG. 11, the physical wiring possibility determining section 15a calculates wiring possible area for each of layers that constitute the printed circuit board according to information such as a circuit board size (shape and area of the circuit board), the number of circuit board layers, component arrangement, and wiring constraining conditions (Step S1101, see FIG. 4).

The physical wiring possibility determining section 15a calculates a theoretical length for each layer according to the Manhattan length for all the signals contained in the net information read from the printed circuit board data storage section 14a and corrects each of the theoretical lengths calculated for all the signals of each layer according to the wiring constraining information (for example, isometric length condition value and isometric length group), and then calculates a total theoretical wiring length by calculating the sum total of the theoretical lengths calculated for each layer (Step S1102, see FIG. 5).

The physical wiring possibility determining section 15a calculates a wiring length for each layer when a wiring possible area is filled with wiring lines, according to the net information (for example, standard signal line width and standard signal interval) read from the printed circuit board data storage section 14a, and calculates a wiring channel total length by calculating the sum total of all the wiring lengths calculated for each of the layers (Step S1103, see FIG. 6).

After the calculation of the total theoretical wiring length and the wiring channel total length, the physical wiring possibility determining section 15a determines if the physical wiring channel capacity is insufficient, by comparing the total theoretical wiring length with the wiring channel total length (Step S1104). After comparing the total theoretical wiring length with the wiring channel total length, the physical wiring possibility determining section 15a determines that the physical wiring channel capacity is insufficient when the total theoretical wiring length is greater than the wiring channel total length (Yes at Step S1104), then terminates the automatic wiring processing because of the insufficient physical wiring channel capacity.

As a result of the comparison of the total theoretical wiring length and the wiring channel total length, the physical wiring possibility determining section 15a determines that the physical wiring channel capacity is sufficient when the wiring channel total length is greater than the total theoretical wiring length (No at Step S1104), and goes on to local channel neck determining processing.

When going on to the local channel neck determining processing, the physical wiring possibility determining section 15a sets, at an initial value ("0"), the number of wiring lines that pass through each cell into which each of layers of the printed circuit board is divided evenly in a grid pattern (Step S1105, see FIG. 7).

The physical wiring possibility determining section 15a calculates the number of wiring lines that pass through each cell for each net (Step S1106). More specifically, the physical wiring possibility determining section 15a refers to wiring route information that is read from the printed circuit board data storage section 14a, and if counting is performed in a net where wiring routes are set, for example, as shown in FIG. 8, in a layer L3 where a wiring route R1 having the number of nets "4" that connects pins of components C1 and C2, counting of the number of wiring lines that pass through each cell for each net is performed (for example, in a certain cell in the layer L3, counting of the number of wiring lines "2" is performed).

If the physical wiring possibility determining section 15a performs counting in a net where a wiring path is not set yet, counting of the number of wiring lines that pass through each cell for each net is performed (for example, counting of the numbers of wiring lines "2" and "1" in certain cells in the layer L3, and counting of the number of wiring line "1" in a certain cell in the layer L2 are performed), under the condition that, for example, as shown in FIG. 9, the component pins are connected by Manhattan and layers are switched (switched from the layer L2 to the layer L3) so that the number of wiring lines that pass through each cell is the smallest.

After the counting of the number of wiring lines that pass through each cell for each net, the physical wiring possibility determining section 15a determines if there is a local channel neck by comparing the number of cells where the number of the counted wiring lines is above the number of wiring lines that can be housed therein with a set value that is set in advance by a user for each cell (Step S1107). When it is determined that the number of cells where a number of counted wiring lines is above the number of wiring lines that can be housed therein is above the set value set by the user, it is determined that there is a local channel neck, and thus the processing is terminated because automatic wiring processing is physically impossible.

When the physical wiring possibility determining section 15a determines that the number of cells where the number of counted wiring lines is above the number of wiring lines that can be housed therein is not above the set value set by the user (No at Step S1107), it is determined that there is not a local channel neck, and the physical wiring possibility determining section 15a goes on to automatic wiring processing process creating processing in the automatic wiring processing process creating section 15b.

A flow of the automatic wiring processing process creating processing according to the first embodiment will be described with reference to FIGS. 12 and 13. As shown in FIG. 12, the automatic wiring processing process creating section 15b reads printed circuit board data for each printed circuit board from the printed circuit board data storage section 14a, and executes the processing for each printed circuit board in a flow described below. The automatic wiring processing process creating section 15b first determines if assignment of a route layer is completed (Step S1201).

When the assignment of the route layer is not completed (NO at Step 1201), the automatic wiring processing process creating section 15b registers a layer assignment automatic creating process in the automatic wiring processing process (Step S1202).

When the assignment of the route layer is completed (YES at Step S1201) or after the registration of the layer assignment automatic creating process, the automatic wiring processing process creating section 15b determines if lead wiring is completed (Step S1203).

When the lead wiring is not completed (NO at Step S1203), the automatic wiring processing process creating section 15b registers a lead wiring executing process in the automatic wiring processing process (Step S1204).

When the lead wiring is completed (YES at Step S1203) or after the registration of the lead wiring executing process, the automatic wiring processing process creating section 15b determines if net wiring of the same bus group is completed (Step S1205).

When the net wiring of the same bus group is not completed (NO at Step S1205), the automatic wiring processing process creating section 15b registers the automatic wiring executing process of the same bus group in the automatic wiring processing process (Step S1206).

When the net wiring of the same bus group is completed (YES at Step S1205) or after the registration of the automatic wiring executing process of the same bus group, the automatic wiring processing process creating section 15b determines if net wiring having a pair/differentiation property is completed (Step S1207).

When the net wiring having pair/differentiation property is not completed (NO at Step S1207), the automatic wiring processing process creating section 15b registers an automatic wiring executing process of a net having pair/differentiation property in the automatic wiring processing process (Step S1208).

When the net wiring having pair/differentiation property is completed (YES at Step S1207) or after the registration of an automatic wiring executing process of a net having pair/differentiation property, the automatic wiring processing process creating section 15b determines if the other net wiring is completed (Step S1209).

When the other net wiring is not completed (NO at Step S1209), the automatic wiring processing process creating section 15b registers an automatic wiring executing process of wiring uncompleted net in the automatic wiring processing process (Step S1210).

When the other net wiring is completed (YES at Step S1209) or after the registration of automatic wiring executing process of wiring uncompleted net, the automatic wiring processing process creating section 15b determines if mitering (reshaping of a wiring path by a line)/spacing (making neighboring lines equally spaced) is enough (Step S1211).

When the mitering (reshaping of a wiring path by a line)/spacing (making neighboring lines equally spaced) is not enough (NO at Step S1211), the automatic wiring processing process creating section 15b registers a mitering/spacing executing process in the automatic wiring processing process (Step S1212).

When the mitering/spacing is enough (YES at Step S1211) or after the registration of the mitering/spacing executing process, the automatic wiring processing process creating section 15b outputs and displays an automatic wiring processing process created by the registration of the processes on the output unit 12, and thus provides as text data (see FIG. 13) the same to the user (Step S1213).

The automatic wiring processing process creating section 15b confirms if the modifying instruction is received from the user (Step S1214). When the modifying instruction is received from the user (YES at Step S1214), the automatic wiring processing process creating section 15b modifies (or corrects) the automatic wiring process according to the modifying instruction from the user (Step S1215), and transmits the same to the automatic wiring processing associating section 15d, which will be described below. When the modifying instruction is not received from the user, for example, an approving instruction for the automatic wiring process is received (NO at Step S1214), however, the automatic wiring processing process creating section 15b transmits the automatic wiring processing process without any modification to the automatic wiring processing associating section 15d, which will be described below.

A flow of the monitoring action processing according to the first embodiment will be described with reference to FIG. 14. The automatic wiring processing monitoring section 15f executes the processing for each printed circuit board in the flow described below.

As shown in FIG. 14, when automatic wiring processing is started by the automatic wiring processing section 15e (YES at Step S1401), the automatic wiring processing monitoring section 15f collects each piece of historical information showing progress of the automatic wiring processing for each of evaluation items (for example, an elapsed time from the beginning of the processing, a wiring ratio or a fluctuation rate thereof at a certain time after the beginning, the number of wiring errors, resource condition of devices such as the CPU and the memory) for evaluating the situation of the automatic wiring processing executed by the automatic wiring processing section 15e (Step S1402).

While collecting the historical information, the automatic wiring processing monitoring section 15f outputs and displays, in real time, the situation of the automatic wiring processing in running, thereby notifying the same to the user (Step S1403), and checks to see if there is an interrupt from the user for suspending the automatic wiring processing (Step S1404).

Then, the automatic wiring processing monitoring section 15f executes a monitoring action according to historical information showing the progress of the automatic wiring processing or information showing if there is the interrupt received from the user (Step S1405).

More specifically, the automatic wiring processing monitoring section 15f compares each threshold, such as threshold set as default or by the user, that is set in advance for each evaluation item with each piece of historical information collected at the monitoring, and executes a monitoring action for each evaluation item according to the result of the comparison.

For example, when a wiring ratio after a certain time is not above the threshold, or when the number of wiring errors is above the threshold, the automatic wiring processing monitoring section 15f transmits a suspending instruction to the automatic wiring processing section 15e so that the automatic wiring processing is suspended, as well as decides to re-create an automatic wiring processing process and transmits a re-creating instruction of the automatic wiring processing process to the automatic wiring processing process creating section 15b.

When an elapsed time from the beginning of the automatic wiring processing is above the threshold, the automatic wiring processing monitoring section 15f transmits a terminating instruction to the automatic wiring processing section 15e so that the automatic wiring processing is terminated. The automatic wiring processing monitoring section 15f may notify to the user an elapsed time from the beginning of the automatic wiring processing or fluctuation of processing situation (for example, increase of wiring ratio or of the number of wiring errors).

When receiving an interrupt for suspending the automatic wiring processing from the user, the automatic wiring processing monitoring section 15f transmits a suspending instruction to the automatic wiring processing section 15e so that the automatic wiring processing is suspended. Then, when receiving from the user modification of wiring that is completed in the automatic wiring processing, the automatic wiring processing monitoring section 15f decides to restart automatic wiring processing in the condition where the completed wiring is modified, and transmits a processing restarting instruction to the automatic wiring processing section 15e so that automatic wiring processing is restarted in the condition where the modification of wiring by the user is reflected therein.

After execution of the monitoring action, the automatic wiring processing monitoring section 15f determines if all the automatic wiring processing corresponding to each process registered in the automatic wiring processing process are completed (Step S1406). When the entire automatic wiring processing is completed (YES at Step S1406), the automatic wiring processing monitoring section 15f terminates the monitoring action processing. When the entire automatic wiring processing is not completed (NO at Step S1406), the automatic wiring processing monitoring section 15f keeps monitoring the automatic wiring processing and collecting historical information of the automatic wiring processing.

As described above, according to the first embodiment, a design processing period of a printed circuit board can be reduced by eliminating manual work as much as possible in design processing of a printed circuit board, because, in the first embodiment, printed circuit board data including various physical information regarding the printed circuit board is stored in the printed circuit board data storage section 14a for each printed circuit board, printed circuit board data for each printed circuit board is read therefrom, an automatic wiring processing process is automatically created according to a result of analyzing settings, wiring progress, and wiring situation at present for each printed circuit board, and thus automatic wiring processing is executed for each printed circuit board according to the automatic wiring processing process.

According to the first embodiment, automatic wiring processing can be executed according to an automatic wiring processing process customized by the user, because in the first embodiment, the automatic wiring processing process is first notified to the user and when modification of the automatic wiring processing process notified to the user is received from the user, the automatic wiring processing process is modified according to the modification received from the user, the automatic wiring processing is executed according to the modified automatic wiring processing process, and thus the automatically created automatic wiring processing process can be customized by the user.

According to the first embodiment, a design period can be reduced efficiently, because in the first embodiment, if automatic wiring processing is physically possible is determined according to the printed circuit board data, an automatic wiring processing process is automatically created when the automatic wiring processing is determined to be physically executable, and thus automatic wiring processing can be executed only on physically wiring possible printed circuit boards.

According to the first embodiment, a design period can be reduced as a result that in the first embodiment, if the external apparatus 20 is utilized in executing automatic wiring processing is determined according to load required for automatic wiring processing of a printed circuit board, and thus the automatic wiring process can be executed by effectively utilizing the external resources when processing load thereof increases depending on some factors such as a wiring area or the number of nets.

According to the first embodiment, automatic wiring processing can be executed reflecting an approach from the user, for example, in automatic wiring processing where the wiring ratio cannot be improved, because in the first embodiment, the situation of an automatic wiring processing in a printed circuit board is notified to the user, and when modification of various uncompleted processing in the automatic wiring processing is received from the user, an automatic wiring processing process for the uncompleted processing is created according to the modification of an execution sequence thereof received from the user, the automatic wiring processing in running is suspended, and automatic wiring processing is restarted according to the automatic wiring processing process for the various uncompleted processing.

According to the first embodiment, automatic wiring processing can be efficiently executed, because in the first embodiment, the automatic wiring processing is executed concurrently on regions or layers of the printed circuit board where the automatic wiring processing does not interfere with each other.

According to the first embodiment, a design processing period of a printed circuit board can be efficiently reduced, because in the first embodiment, historical information showing the progress of automatic wiring processing is collected for each of evaluation items for evaluating the situation of the automatic wiring processing, a monitoring action is executed according to various historical information thus collected, and thus an action according to the situation of the automatic wiring processing can be automatically executed.

According to the first embodiment, various monitoring actions (for example, notifying situation of automatic wiring processing and suspension, termination, and new execution of automatic wiring processing according to the automatic wiring processing process) according to various evaluation items (for example, a wiring ratio and the number of wiring errors) for evaluating the situation of automatic wiring processing can be executed in a simple way, because in the first embodiment, a monitoring action associated to each of the evaluation items is executed according to a result of comparing various thresholds set in advance such that each of the evaluation items is associated to each of the thresholds with various historical information.

According to the first embodiment, a design processing period of a printed circuit board can be certainly reduced, because in the first embodiment, if an automatic wiring processing process of automatic wiring processing in running is re-created is determined according to a result of comparing various thresholds set in advance such that each of the evaluation items is associated with each of the thresholds with various historical information, the automatic wiring processing is then re-executed according to the automatic wiring processing process thus re-created, and thus the automatic wiring processing can be re-executed by automatically re-creating the automatic wiring processing process according to the situation of automatic wiring processing.

According to the first embodiment, automatic wiring processing can be restarted so that an instruction from the user is reflected therein, because in the first embodiment, when an interrupt for suspending the automatic wiring processing and modification of completed wiring in the automatic wiring processing in running are received from the user, the automatic wiring processing where the completed wiring is modified is restarted.

The present invention may be implemented in various other embodiments other than the first embodiment. Thus, a second embodiment will be described as another embodiment of the present invention.

(1) Configuration

The constituent elements of the wiring design processing apparatus 10 shown in FIG. 2 are functionally conceptual and are not always physically configured as illustrated. Specifically, a specific arrangement in which the wiring design processing apparatus 10 is dispersed or integrated is not limited to the illustrated arrangement. The wiring design processing apparatus 10 may be configured by functionally or physically dispersing or integrating all or some of the devices on a given unit according to various loads or service conditions, for example, by integrating the automatic wiring processing associating section 15d and the automatic wiring processing section 15e, or by mounting some of various functions (for example, a processing function for creating an automatic wiring processing process according to modification of an execution sequence in various uncompleted processing in automatic wiring processing received from the user) on the automatic wiring processing monitoring section 15f. All or some of the processing functions performed by the wiring design processing apparatus 10 (see, for example, FIGS. 10 to 12 and FIG. 14) may be implemented by a CPU or a computer program that is analyzed and executed by the CPU, or by wired-logic hardware.

All or some of the various processings (for example, re-creating of an automatic wiring processing process executed by the automatic wiring processing process creating section 15b) described to be executed automatically in the present embodiments may be performed manually.

(2) Wiring Design Processing Program

Figure 15:
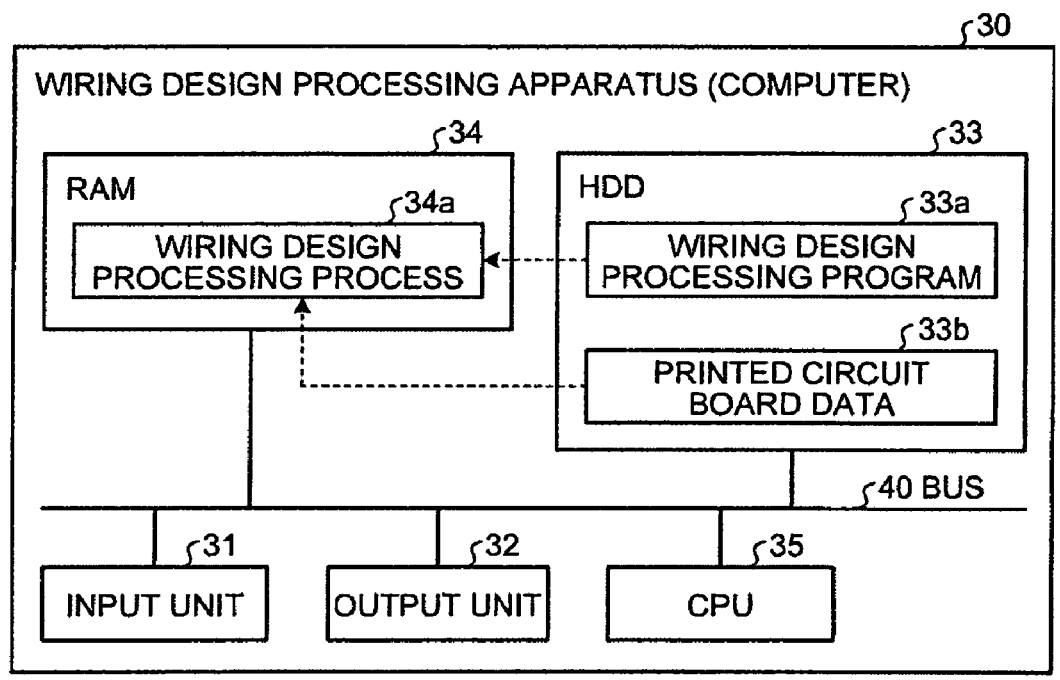
FIG. 15 is a schematic of a computer executing a wiring design processing program according to an embodiment of the present invention.

Various processing of the wiring design processing apparatus 10 described in the embodiments (see, for example, FIGS. 10 to 12, and 14) can be implemented by executing, on a computer system such as a personal computer or a workstation, a program prepared in advance. Thus, referring to FIG. 15, an example of a computer that executes a wiring design processing program having functions similar to the embodiments will be described below. FIG. 15 is a diagram of a computer that executes a wiring design processing program.

As shown in FIG. 15, a computer 30, as a wiring design processing apparatus, is configured such that the computer 30 includes an input unit 31, an output unit 32, a hard disk drive (HDD) 33, a random access memory (RAM) 34, and a CPU 35 are connected to a bus 40.

The input unit 31 receives various data input from a user. The output unit 32 displays various information. The HDD 33 stores therein information necessary for executing various processing by the CPU 35. The RAM 34 stores therein various information temporarily. The CPU 35 performs various arithmetic processing.

As shown in FIG. 15, the HDD 33 stores therein in advance a wiring design processing program 33a that performs functions similar to each processing unit of the wiring design processing apparatus 10 shown in the embodiments and a printed circuit board data 33b. The wiring path information creating program 33a may be optionally distributed and stored in storage units of other computers communicatably connected via network.

When the CPU 35 reads the wiring design processing program 33a from the HDD 33 and expands the same on the RAM 34, the wiring design processing program 33a functions as the wiring design processing process 34a, as shown in FIG. 15. The wiring design processing process 34a reads information such as the printed circuit board data 33b from the HDD 33 and expands the same on a region on the RAM 34 assigned to the wiring design processing process 34a. Thus, the wiring design processing process 34a performs various processing according to data thus expanded. The wiring design processing process 34a corresponds to processing performed in the control unit 15 (the physical wiring possibility determining section 15a, the automatic wiring processing process creating section 15b, the external resource usability determining section 15c, the automatic wiring processing associating section 15d, the automatic wiring processing section 15e, and the automatic wiring processing monitoring section 15f) of the wiring design processing apparatus 10 shown in FIG. 2.

It is not always necessary that the wiring design processing program 33a is stored in the HDD 33 in advance. Each program may be stored in a "portable physical media" such as a flexible disk (FD), a compact disk read only memory (CD-ROM), a digital versatile disk (DVD), a magnetic optical disk, an integrated circuit (IC) card that are inserted to the computer 30, or "other computers (or servers)" connected to the computer 30 via public lines, the Internet, a local area network (LAN), or a wide area network (WAN). Then, the computer 30 may be configured such that the computer 30 reads each program therefrom and executes the same.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A wiring design processing method for designing an automatic wiring processing process as an execution sequence of various processing in automatic wiring processing for printed circuit boards by using a computer, the wiring design processing method comprising:

storing, in a storage unit, printed circuit board information including various physical information regarding each of the printed circuit boards;

creating an automatic wiring processing process automatically for each of the printed circuit boards according to a result of analyzing setting, wiring progress, and wiring situation at present regarding each of the printed circuit boards, after reading the printed circuit board information stored in the storage unit at the storing; and executing the automatic wiring processing for each of the printed circuit boards according to the automatic wiring processing process created at the creating.

2. The wiring design processing method according to claim 1, further comprising:

notifying to a user the automatic wiring processing process created;

receiving, from the user, a modification of the automatic wiring processing process notified to the user; and modifying the automatic wiring processing process created, according to the modification received from the user, wherein the automatic wiring processing is executed at the executing according to the automatic wiring processing process modified.

3. The wiring design processing method according to claim 1, further comprising determining if the automatic wiring processing is physically executable, according to the printed circuit board information stored in the storage unit, wherein
the automatic wiring processing process is automatically created at the creating when it is determined at the determining that the automatic wiring processing is physically executable.

4. The wiring design processing method according to claim 1, further comprising determining if an external resource is utilized in executing the automatic wiring processing, according to a load required for the automatic wiring processing of the printed circuit boards.

5. The wiring design processing method according to claim 1, further comprising:
notifying to a user in real time a situation of the automatic wiring processing of the printed circuit boards; and
receiving, from the user, a modification of an execution sequence of various uncompleted processing in the automatic wiring processing, wherein
the creating includes creating an automatic wiring processing process for the various uncompleted processing according to the modification of the execution sequence received from the user, and
the executing includes suspending the automatic wiring processing in running and restarting the automatic wiring processing according to the automatic wiring processing process created for the various uncompleted processing.

6. The wiring design processing method according to claim 1, wherein the executing includes executing the automatic wiring processing concurrently on regions of the printed circuit boards or layers constituting the printed circuit boards where the automatic wiring processing does not interfere with each other.

7. The wiring design processing method according to claim 1, further comprising:
collecting historical information showing progress of the automatic wiring processing for each of evaluation items for evaluating a situation of the automatic wiring processing executed; and
executing a monitoring action according to the historical information collected.

8. The wiring design processing method according to claim 7, wherein the executing a monitoring action includes executing a monitoring action associated to each of the evaluation items according to a result of comparing thresholds set in advance so that each of the thresholds is associated to each of the evaluation items, with the historical information collected.

9. The wiring design processing method according to claim 7, wherein
the executing a monitoring action includes determining if the automatic wiring processing process for the automatic wiring processing in running is re-created according to a result of comparing thresholds set in advance so that each of the thresholds is associated to each of the evaluation items, with the historical information collected,
the creating includes re-creating the automatic wiring processing process when it is determined that the automatic wiring processing process is re-created, and
the executing the automatic wiring processing process includes re-executing the automatic wiring processing according to the automatic wiring processing process re-created.

10. The wiring design processing method according to claim 7, further comprising:
receiving from a user an interrupt for suspending the automatic wiring processing executed by the automatic wiring processing process; and
receiving from the user a modification of completed wiring in the automatic wiring processing executed by the automatic wiring processing process, wherein
the executing a monitoring action includes suspending the automatic wiring processing in running after receiving the interrupt from the user, and restarting of the automatic wiring processing, in a condition where the completed wiring is modified, is decided after receiving, from the user, the modification of the completed wiring, and
the executing the automatic wiring processing process includes restarting, when restarting of the automatic wiring processing in the condition where the completed wiring is modified is decided at the executing the monitoring action, the automatic wiring processing in the condition where the completed wiring is modified.

11. A computer program product having a non-transitory computer readable medium including programmed instructions for designing an automatic wiring processing process as an execution sequence of various processing in automatic wiring processing for printed circuit boards, wherein the instructions, when executed by a computer, cause the computer to perform:
storing, in a storage unit, printed circuit board information including various physical information regarding each of the printed circuit boards;
creating an automatic wiring processing process automatically for each of the printed circuit boards according to a result of analyzing setting, wiring progress, and wiring situation at present regarding each of the printed circuit boards, after reading the printed circuit board information stored in the storage unit at the storing; and
executing the automatic wiring processing for each of the printed circuit boards according to the automatic wiring processing process created at the creating.

12. A wiring design processing apparatus for designing an automatic wiring processing process as an execution sequence of various processing in automatic wiring processing for printed circuit boards by using a computer, the wiring design processing apparatus comprising:
a storage unit that stores therein printed circuit board information including various physical information regarding each of the printed circuit boards;
a process creating unit that creates an automatic wiring processing process automatically for each of the printed circuit boards according to a result of analyzing setting, wiring progress, and wiring situation at present regarding each of the printed circuit boards, after reading the printed circuit board information, stored in the storage unit; and
a automatic wiring processing unit that executes the automatic wiring processing for each of the printed circuit boards according to the automatic wiring processing process created by the creating unit.

* * * * *